United States Patent
Baek et al.

(10) Patent No.: US 11,037,971 B2
(45) Date of Patent: Jun. 15, 2021

(54) FAN-OUT SENSOR PACKAGE AND OPTICAL FINGERPRINT SENSOR MODULE INCLUDING THE SAME

(71) Applicant: SAMSUNG ELECTRONICS CO., LTD., Suwon-si (KR)

(72) Inventors: Yong Ho Baek, Suwon-si (KR); Jung Hyun Cho, Suwon-si (KR); Min Keun Kim, Suwon-si (KR); Young Sik Hur, Suwon-si (KR); Tae Hee Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/844,717

(22) Filed: Apr. 9, 2020

(65) Prior Publication Data
US 2020/0235154 A1    Jul. 23, 2020

Related U.S. Application Data

(63) Continuation of application No. 15/828,993, filed on Dec. 1, 2017, now Pat. No. 10,644,046.

(30) Foreign Application Priority Data

Apr. 7, 2017   (KR) .................... 10-2017-0045502
Jul. 19, 2017   (KR) .................... 10-2017-0091475

(51) Int. Cl.
*H01L 27/146*   (2006.01)
*H01L 27/32*    (2006.01)
(Continued)

(52) U.S. Cl.
CPC ........ *H01L 27/14618* (2013.01); *G02B 5/208* (2013.01); *G06K 9/0004* (2013.01);
(Continued)

(58) Field of Classification Search
None
See application file for complete search history.

(56) References Cited

U.S. PATENT DOCUMENTS 3,717,775 A    2/1973  Kasperkovitz
7,141,884 B2 * 11/2006  Kojima .............. H01L 23/3121
                                                257/778
(Continued)

FOREIGN PATENT DOCUMENTS

CN       106158772 A    11/2016
JP       2005-110896 A   4/2005
(Continued)

OTHER PUBLICATIONS

Taiwanese Office Action dated Dec. 7, 2018 issued in Taiwanese Patent Application No. 106143769.
(Continued)

*Primary Examiner* — Michelle Mandala
*Assistant Examiner* — Jordan M Klein
(74) *Attorney, Agent, or Firm* — Sughrue Mion, PLLC

(57) ABSTRACT

There are provided a fan-out sensor package and an optical fingerprint sensor module including the same. The fan-out sensor package includes: a connection member having a 5 through-hole; an image sensor disposed in the through-hole of the connection member and having an active surface having connection pads disposed thereon and an inactive surface opposing the active surface; an encapsulant encapsulating at least portions of the connection member, the image sensor, and 10 an optical lens; and a redistribution layer disposed on the connection member, the image sensor, and the optical lens. The connection member includes a wiring layer, and the redistribution layer electrically connects the wiring layer and the connection pads to each other.

18 Claims, 15 Drawing Sheets

(51) Int. Cl.
*H01L 23/00* (2006.01)
*G02B 5/20* (2006.01)
*G06K 9/00* (2006.01)

(52) U.S. Cl.
CPC .......... *H01L 24/20* (2013.01); *H01L 27/1462* (2013.01); *H01L 27/14627* (2013.01); *H01L 27/14636* (2013.01); *H01L 27/14643* (2013.01); *H01L 27/14689* (2013.01); *H01L 27/3234* (2013.01); *H01L 2224/16225* (2013.01); *H01L 2224/214* (2013.01); *H01L 2224/32225* (2013.01); *H01L 2224/73204* (2013.01); *H01L 2924/15311* (2013.01); *H01L 2924/19105* (2013.01); *H01L 2924/3511* (2013.01)

(56) References Cited

U.S. PATENT DOCUMENTS

| | | | | |
|---|---|---|---|---|
| 7,736,930 | B2* | 6/2010 | Abela | H01L 27/14618 438/51 |
| 8,717,775 | B1* | 5/2014 | Bolognia | H01L 24/06 361/803 |
| 9,406,580 | B2 | 2/2016 | Erhart et al. | |
| 10,629,641 | B2* | 4/2020 | Lee | G06K 9/0004 |
| 2006/0289733 | A1* | 12/2006 | Zung | H01L 24/20 250/239 |
| 2008/0083980 | A1* | 4/2008 | Yang | H01L 27/14683 257/700 |
| 2008/0157250 | A1* | 7/2008 | Yang | H04N 5/2257 257/433 |
| 2008/0157342 | A1* | 7/2008 | Yang | H01L 23/467 257/700 |
| 2008/0157358 | A1* | 7/2008 | Yang | H01L 23/5389 257/737 |
| 2008/0173792 | A1* | 7/2008 | Yang | H01L 24/18 250/208.1 |
| 2008/0191297 | A1* | 8/2008 | Yang | H01L 27/14632 257/432 |
| 2008/0197435 | A1* | 8/2008 | Yang | H01L 27/14618 257/432 |
| 2008/0224248 | A1* | 9/2008 | Yang | H01L 27/14625 257/433 |
| 2009/0309202 | A1* | 12/2009 | Hsu | H01L 23/5389 257/680 |
| 2011/0215464 | A1* | 9/2011 | Guzek | H01L 21/56 257/737 |
| 2012/0020026 | A1* | 1/2012 | Oganesian | H01L 21/76877 361/707 |
| 2012/0256280 | A1* | 10/2012 | Erhart | H01L 24/17 257/414 |
| 2012/0313209 | A1* | 12/2012 | Oganesian | H01L 27/1469 257/443 |
| 2013/0056844 | A1* | 3/2013 | Oganesian | H01L 27/14634 257/443 |
| 2015/0033231 | A1* | 1/2015 | Wu | G06K 9/00087 718/100 |
| 2015/0340397 | A1* | 11/2015 | Seo | H01L 27/14623 257/432 |
| 2016/0212852 | A1* | 7/2016 | Hu | H01L 27/14618 |
| 2016/0268326 | A1* | 9/2016 | Yu | H01L 27/14618 |
| 2016/0336249 | A1* | 11/2016 | Kang | H01L 23/552 |
| 2016/0338202 | A1* | 11/2016 | Park | H01L 24/00 |
| 2017/0062240 | A1* | 3/2017 | Wu | H01L 23/562 |
| 2018/0090530 | A1* | 3/2018 | Jeong | H01L 27/14621 |
| 2018/0337142 | A1* | 11/2018 | Cheng | H01L 24/24 |
| 2019/0013346 | A1* | 1/2019 | Tseng | H01L 27/14627 |
| 2019/0103429 | A1* | 4/2019 | Hsu | H01L 27/14636 |

FOREIGN PATENT DOCUMENTS

| | | |
|---|---|---|
| KR | 10-2008-0075450 A | 8/2008 |
| KR | 10-2011-0068489 A | 6/2011 |
| KR | 10-2016-0132763 A | 11/2016 |
| TW | 200837902 A | 3/1997 |
| TW | 201246410 A | 11/2012 |
| TW | 201612704 A | 4/2016 |
| TW | 1571942 B | 2/2017 |

OTHER PUBLICATIONS

Korean Office Action dated Jan. 4, 2019 issued in Korean Patent Application No. 10-2017-0091475.

\* cited by examiner

I-I'

FAN-OUT SENSOR PACKAGE AND OPTICAL FINGERPRINT SENSOR MODULE INCLUDING THE SAME

CROSS-REFERENCE TO RELATED APPLICATIONS

This application is a continuation of U.S. application Ser. No. 15/828,993, filed Dec. 1, 2017, which claims benefit of priority to Korean Patent Application Nos. 10-2017-0045502 filed on Apr. 7, 2017 and 10-2017-0091475 filed on Jul. 19, 2017 in the Korean Intellectual Property Office, the disclosure of which are incorporated herein by reference in their entireties.

TECHNICAL FIELD

The present disclosure relates to a fan-out sensor package, and more particularly, to a fan-out sensor package capable of recognizing a fingerprint in an optical manner, and an optical fingerprint sensor module including the same.

BACKGROUND

In accordance with the trend toward generalization of the use of a fingerprint sensor chip in a smartphone and an increase in a size of a front display in the smartphone, demand for optical fingerprint sensor package technology in which an under-display structure is possible has increased. An optical fingerprint sensor package according to the related art mainly has a structure in which a sensor chip is mounted on an interposer substrate, connection pads of the sensor chip are electrically connected to the interposer substrate by wire bonding, and the sensor chip is molded with a molding material.

However, in the optical fingerprint sensor package having such a structure, due to the wire bonding, a separate optical lens, or the like, put on the sensor chip, the structure of the optical fingerprint sensor package becomes somewhat complicated, and a size and a thickness of the optical fingerprint sensor package are increased. In addition, it is difficult to control a molding thickness, such that a complicated molding process is required, and large warpage of the entire optical fingerprint sensor package is generated due to an asymmetrical structure, such that fingerprint sensing sensitivity is decreased and a yield at the time of mounting the optical fingerprint sensor package is also decreased. In addition, the warpage of the optical fingerprint sensor package generates a difficulty in stacking an infrared cut-off filter and a metal shield in a process of manufacturing a module using the optical fingerprint sensor package.

SUMMARY

An aspect of the present disclosure may provide an ultra-miniature ultra-thin fan-out sensor package capable of solving the problem described above, and an optical fingerprint sensor module including the same.

According to an aspect of the present disclosure, a fan-out sensor package may be provided, in which an image sensor capable of recognizing a fingerprint in an optical manner is disposed in a through-hole of a connection member in which a wiring layer is formed, and connection pads of the image sensor and the wiring layer of the connection member are electrically connected to each other through a redistribution layer.

According to an aspect of the present disclosure, a fan-out sensor package may include: a connection member having a through-hole; an image sensor disposed in the through-hole of the connection member and having an active surface having connection pads disposed thereon and an inactive surface opposing the active surface; an encapsulant encapsulating at least portions of the connection member, the image sensor, and an optical lens; and a redistribution layer disposed on the connection member, the image sensor, and the optical lens, wherein the connection member includes a wiring layer, and the redistribution layer electrically connects the wiring layer and the connection pads to each other.

According to another aspect of the present disclosure, an optical fingerprint sensor module may include: the fan-out sensor package as described above; and a display panel disposed on the fan-out sensor package, wherein the display panel is an organic light emitting diode (OLED) panel.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
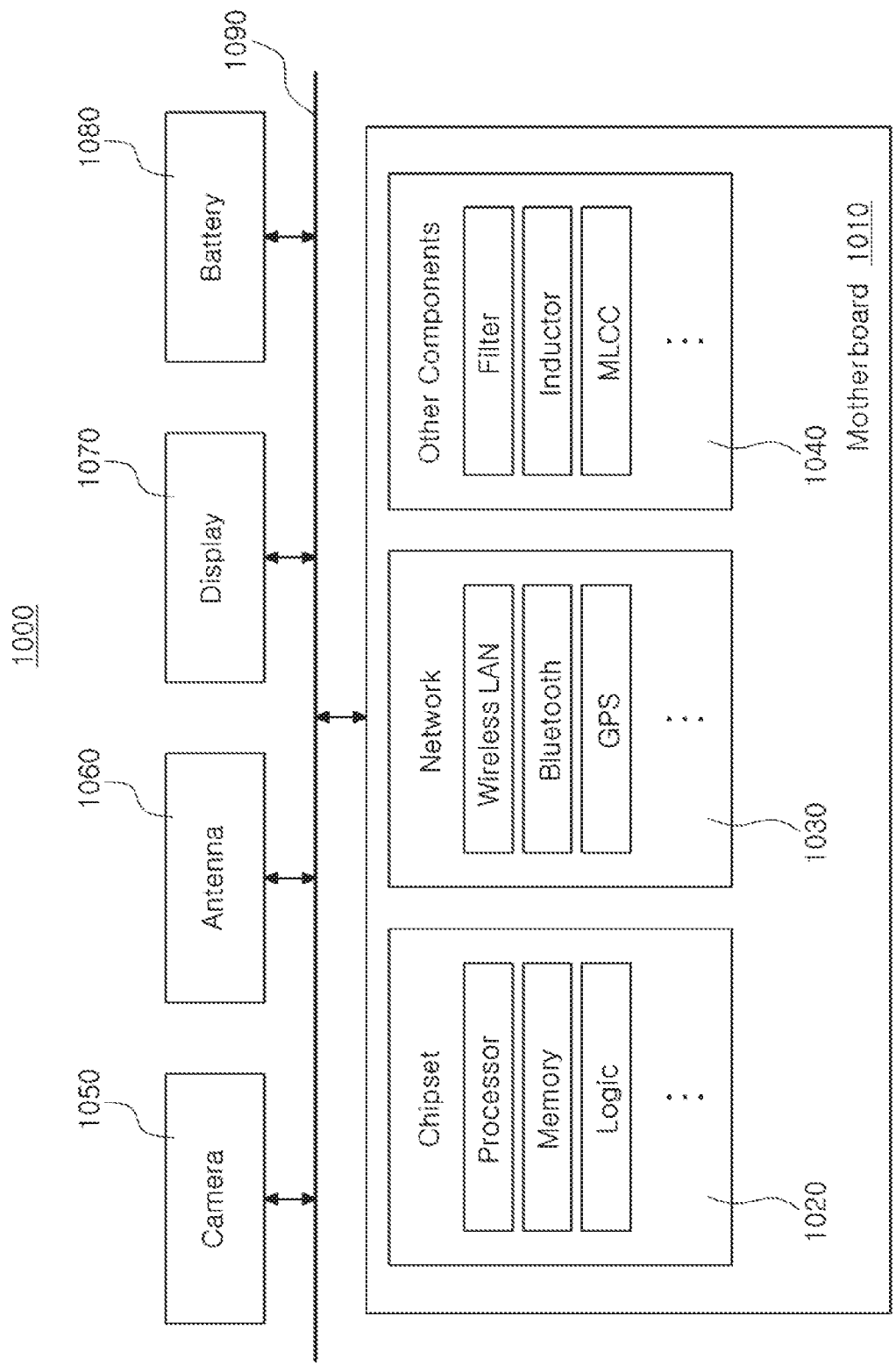
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like However, the electronic device 1000 is not limited thereto, but may be any other electronic device processing data.

Figure 2:
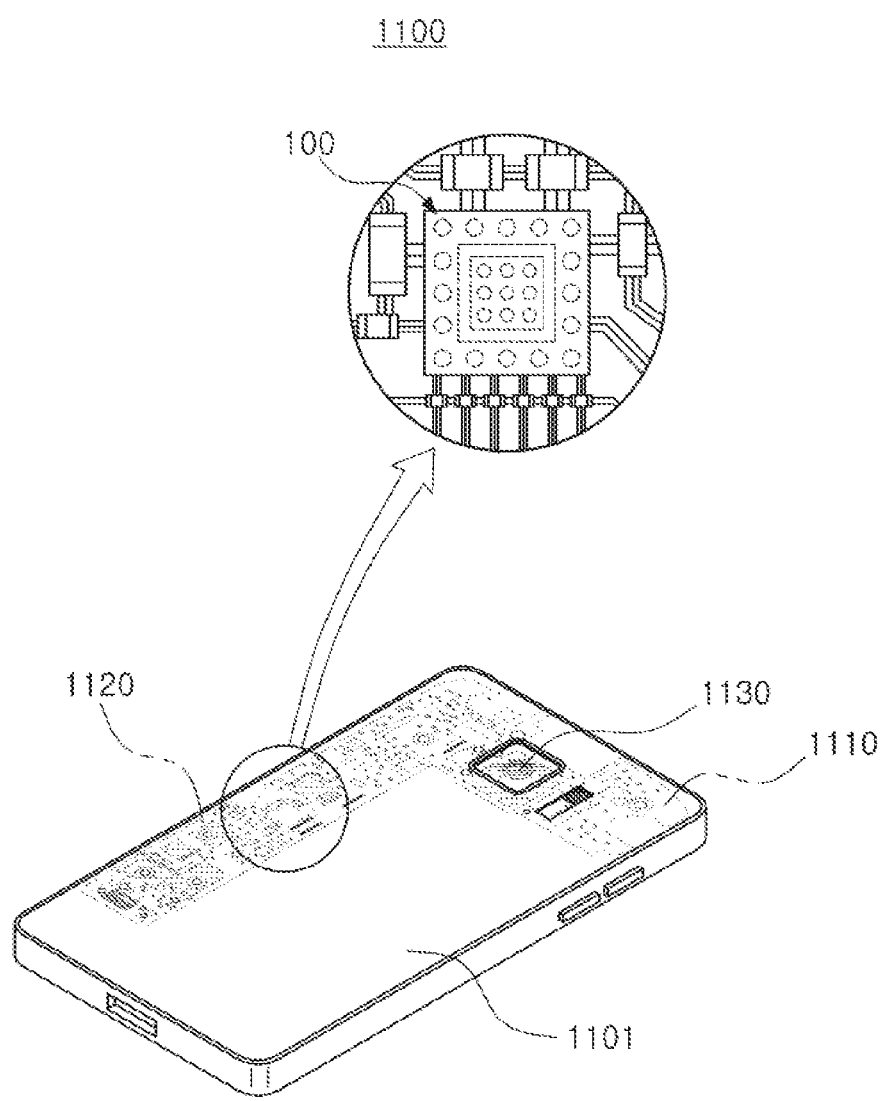
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
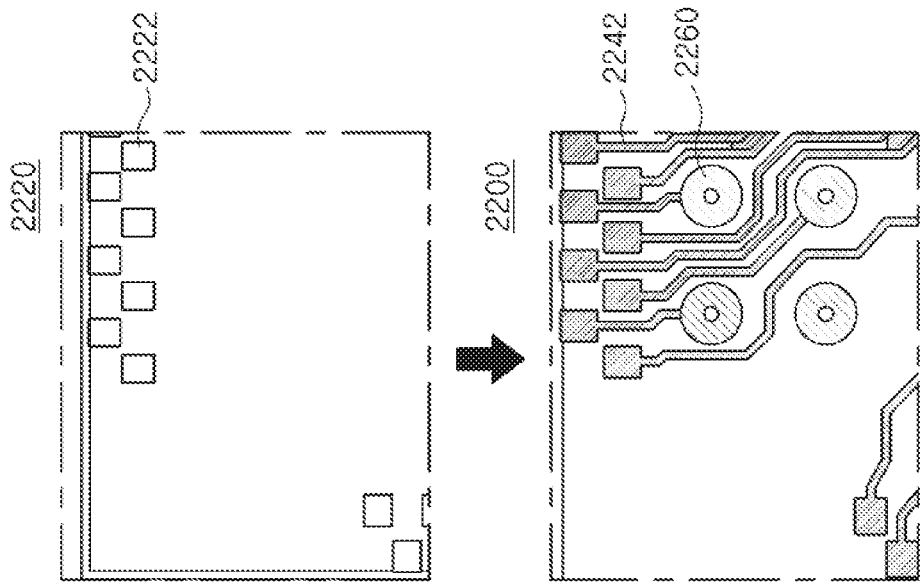
FIGS. 3A and 3B are schematic cross-sectional views illustrating states of a fan-in semiconductor package before and after being packaged.
Figure 3A:
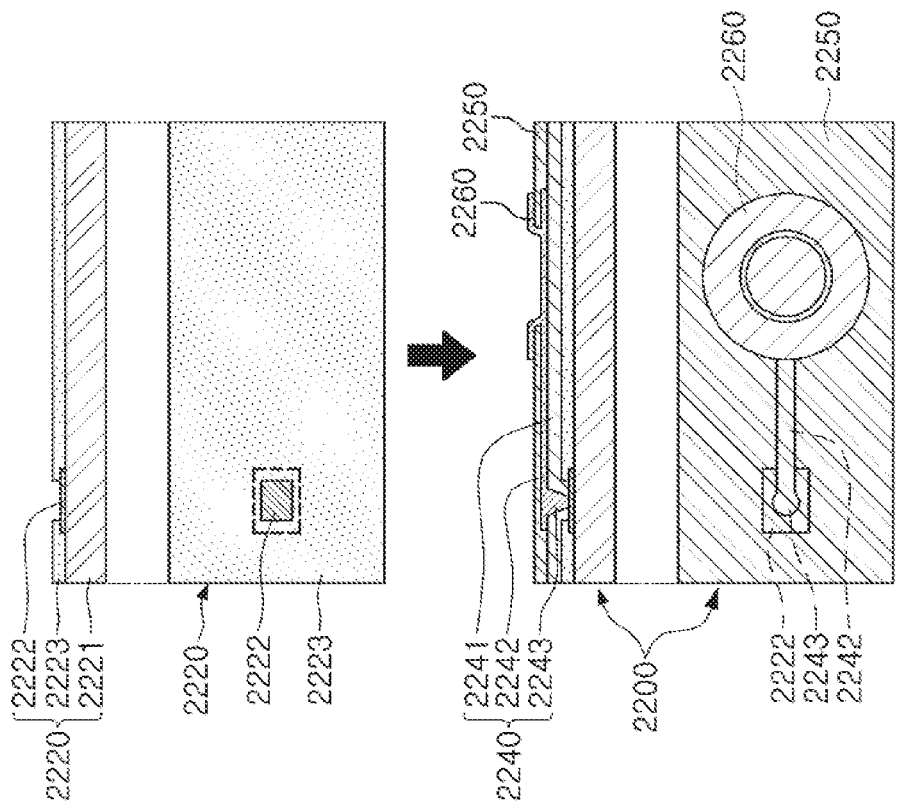

FIGS. 3A and 3B are schematic cross-sectional views illustrating states of a fan-in semiconductor package before and after being packaged.

Figure 4:
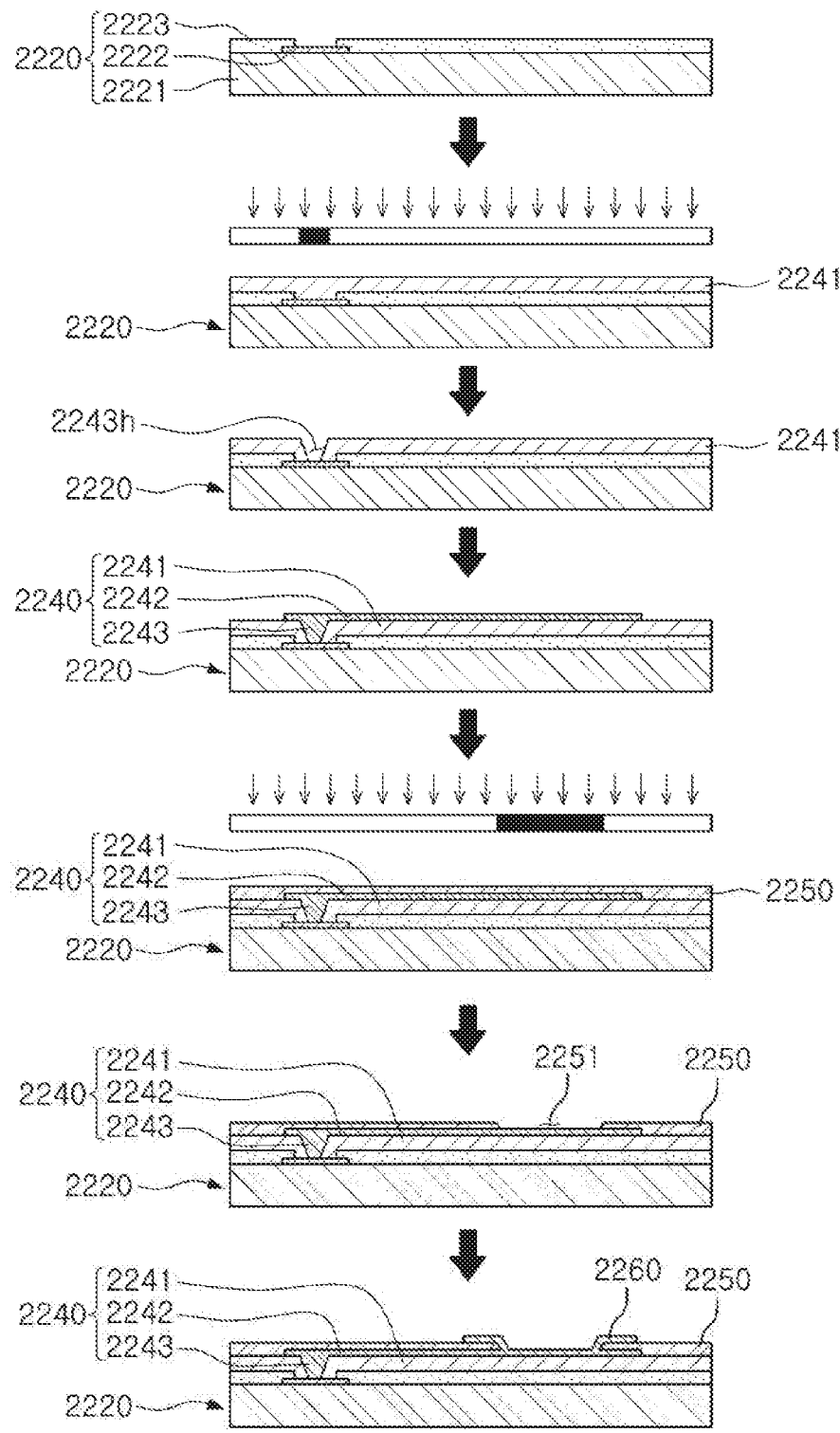
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
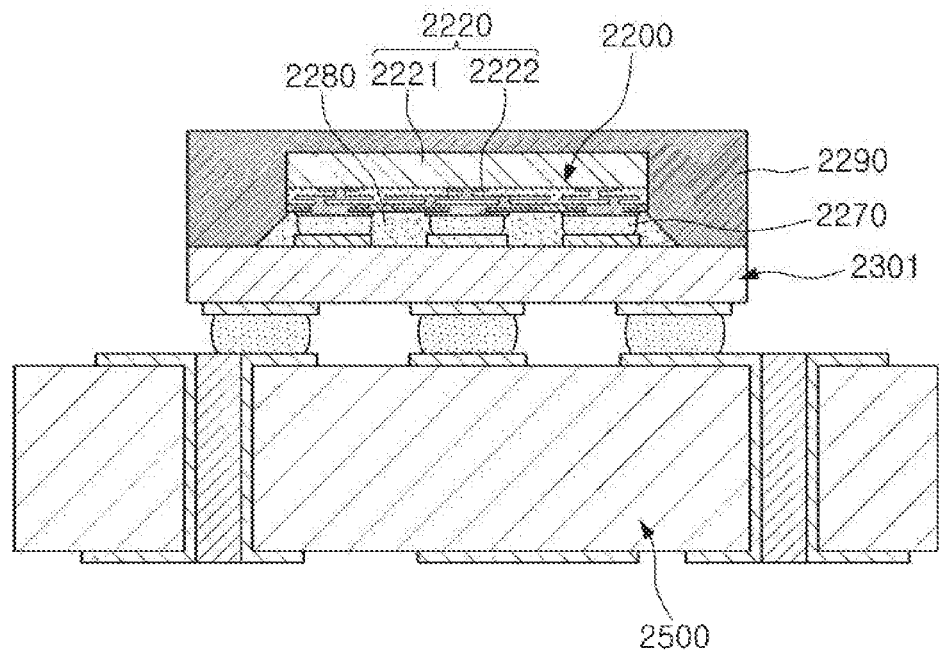
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
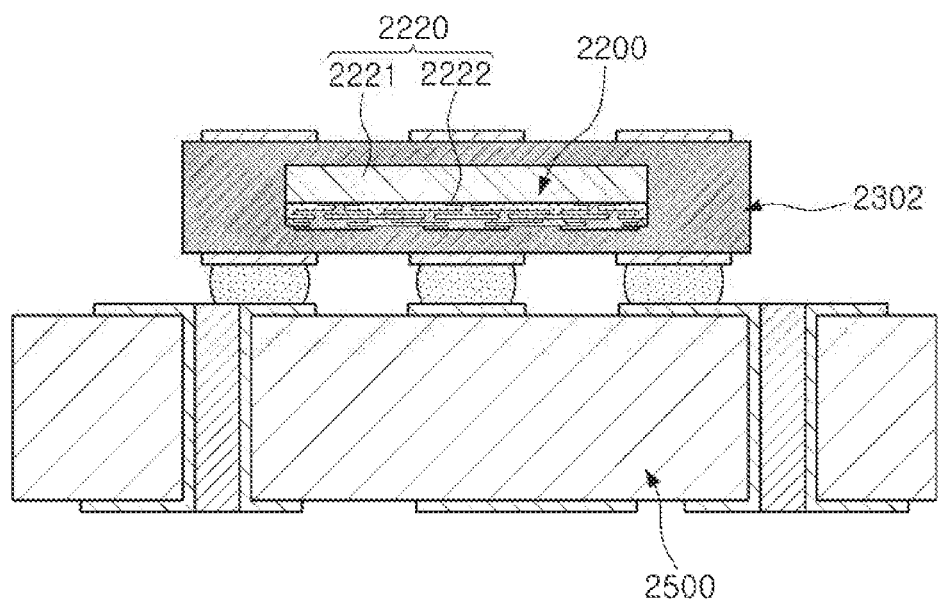
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
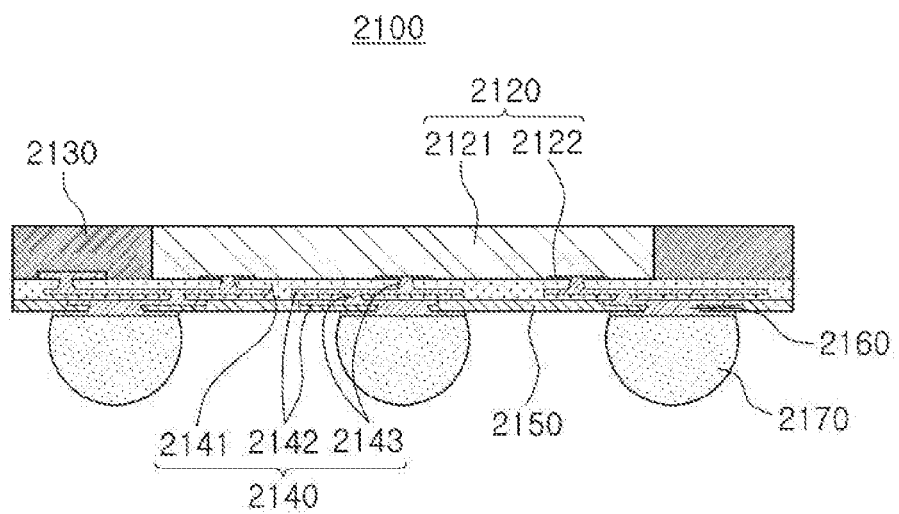
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
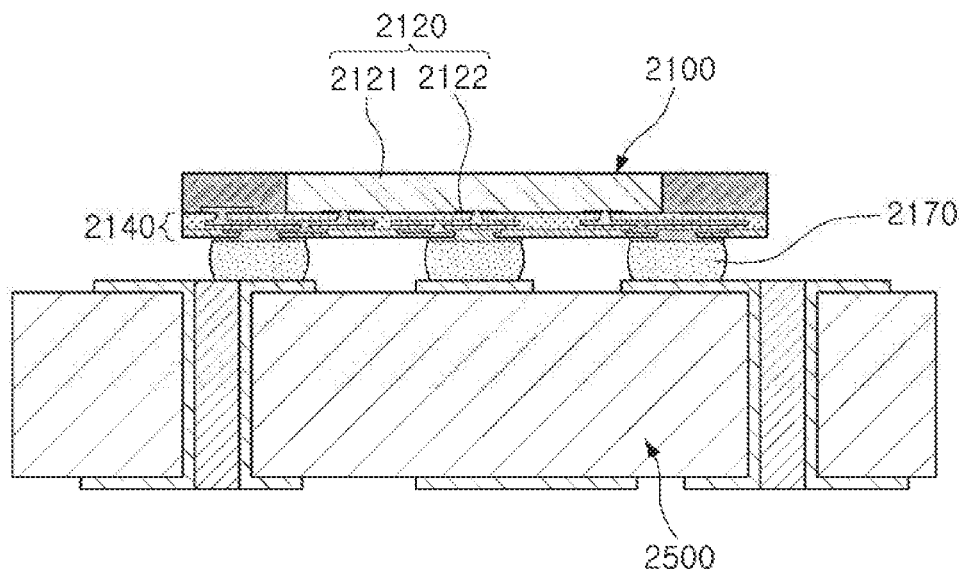
FIG. 8 is a schematic cross-sectional view illustrating a case in which a fan-out semiconductor package is mounted on a main board of an electronic device

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

An ultra-miniature ultra-thin fan-out sensor package having an optical fingerprint recognition function will hereinafter be described with reference to the drawings.

Figure 9:
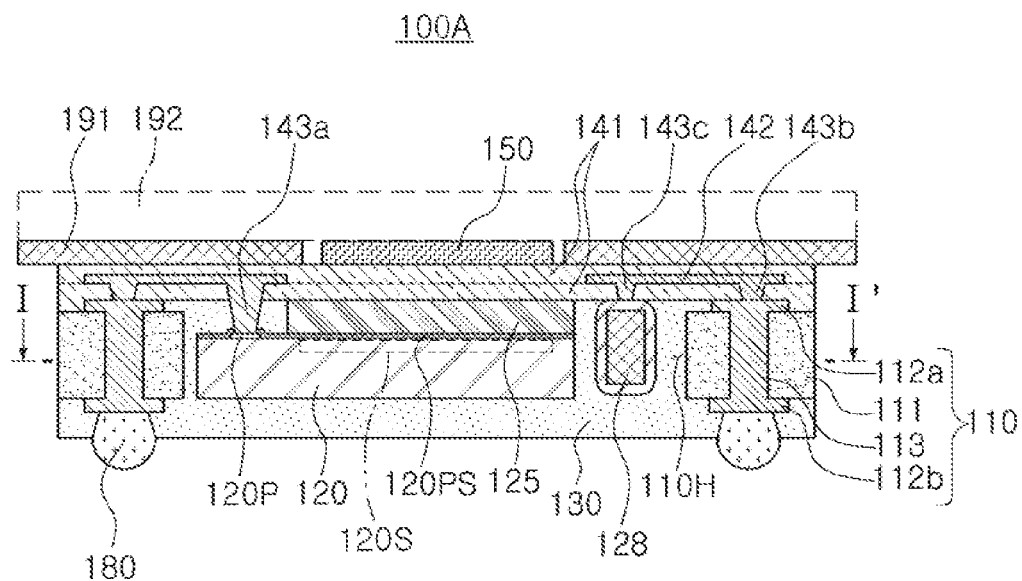
FIG. 9 is a schematic cross-sectional view illustrating an example of a fan-out sensor package.

FIG. 9 is a schematic cross-sectional view illustrating an example of a fan-out sensor package.

Figure 10:
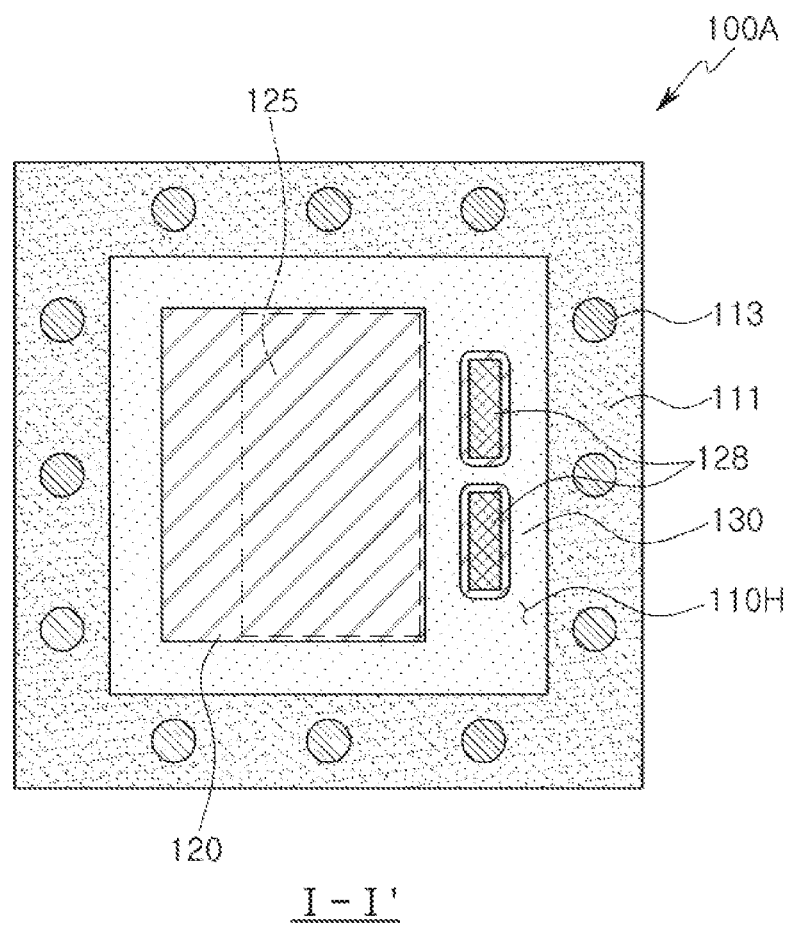
FIG. 10 is a schematic plan view taken along line I-I' of the fan-out sensor package of FIG. 9.

FIG. 10 is a schematic plan view taken along line I-I' of the fan-out sensor package of FIG. 9.

Referring to the drawings, a fan-out sensor package 100A according to an exemplary embodiment in the present disclosure may include a connection member 110 having a through-hole 110H, an image sensor 120 disposed in the through-hole 110H of the connection member 110 and having an active surface having connection pads 120P disposed thereon and an inactive surface opposing the active surface, an optical lens 125 disposed on the active surface of the image sensor 120, an encapsulant 130 encapsulating at least portions of the connection member 110, the image sensor 120, and the optical lens 125, and a redistribution layer 142 disposed on the connection member 110, the active surface of the image sensor 120, and the optical lens 125. The connection member 110 may include wiring layers 112a and 112b, and the redistribution layer 142 may electrically connect the wiring layers 112a and 112b and the connection pads 120P to each other.

In a sensor package according to the related art, a ball grid array (EGA) substrate is generally used. For example, an image sensor is disposed on the EGA substrate, is electrically connected to the EGA substrate by wire bonding, and is molded with a molding material. However, in such a structure, a structure of the sensor package becomes complicated and a size and a thickness of the sensor package are increased, due to the wire bonding disposed on the EGA substrate and the image sensor, an optical lens separately disposed on the image sensor, or the like. In addition, it is difficult to control a molding thickness, such that a complicated molding process is required. In addition, large warpage of the sensor package is generated due to an asymmetrical structure, such that fingerprint sensing sensitivity is decreased and a yield at the time of mounting the sensor package on a circuit board, or the like, is decreased. In addition, the warpage of the sensor package generates a difficulty in stacking an infrared cut-off filter and a metal shield in a process of manufacturing a module using the sensor package.

On the other hand, in the fan-out sensor package 100A according to the exemplary embodiment, the connection member 110 having the wiring layers 112a and 112b may be introduced instead of the EGA substrate, the image sensor 120 having a sensor region 120S and the optical lens 125 having an optical fingerprint recognition function may be disposed in the through-hole 110H of the connection member 110 and be then encapsulated with the encapsulant 130, and the connection pads 120P of the image sensor 120 may be electrically connected to the wiring layers 112a and 112b of the connection member 110 using the redistribution layer 142 and vias 143a and 143b. Therefore, a size and a thickness of the fan-out sensor package 100A according to the exemplary embodiment may be significantly decreased as compared to a structure of an optical fingerprint sensor package according to the related art, and a sensing distance up to a touch panel may thus be significantly decreased, resulting in improvement of sensing sensitivity. Further, in the fan-out sensor package 100A according to the exemplary embodiment, warpage of the fan-out sensor package 100A may be controlled through the connection member 110 and the encapsulant 130, and a defect due to the warpage may thus be significantly decreased. For example, required rigidity may be given to the fan-out sensor package 100A using a thickness and a material of the connection member 110, and the encapsulant 130 may be used to protect the image sensor 120 and implement an approximately symmetrical structure between the encapsulant 130 and an insulating member 141 in which the redistribution layer 142 is formed, resulting in controlling the warpage of the fan-out sensor package 100A.

The respective components included in the fan-out sensor package 100A according to the exemplary embodiment will hereinafter be described below in more detail.

The connection member 110 may maintain rigidity of the fan-out sensor package 100A depending on certain materials, and serve to secure uniformity of a thickness of the encapsulant 130. The connection pads 120P of the image sensor 120 may be electrically connected to the main board of the electronic device through electrical connection structures 180, or the like, by the connection member 110. The connection member 110 may include a plurality of wiring layers 112a and 112b to effectively redistribute the connection pads 120 of the image sensor 120, and may provide a wide wiring design region to significantly suppress redistribution layers from being formed in other regions. The image sensor 120 may be disposed in the through-hole 110H to be spaced apart from the connection member 110 by a predetermined distance. Side surfaces of the image sensor 120 may be surrounded by the connection member 110, but are not limited thereto.

The connection member 110 may include an insulating layer 111, a first wiring layer 112a disposed on an upper surface of the insulating layer 111, a second wiring layer 112b disposed on a lower surface of the insulating layer 111, and vias 113 penetrating through the insulating layer 111 and electrically connecting the first and second wiring layers 112a and 112b to each other. The number of insulating layers constituting the connection member 110 may be further increased, if necessary. In this case, the connection member 110 may have larger numbers of wiring layers and vias. For example, wiring layers may also be disposed between a plurality of insulating layers.

For example, a material including an inorganic filler and an insulating resin may be used as a material of the insulating layer 111. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Build up Film (ABF), FR-4, Bismaleimide Triazine (BT), a photoimagable dielectric (PID) resin, BT, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used as the insulating material. Alternatively, a glass plate, a ceramic plate, a metal plate, or the like, may be used.

The wiring layers 112a and 112b may be a conductive material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on designs of their corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include pad patterns for vias, pad patterns for electrical connection structures, and the like. Thicknesses of the wiring layers 112a and 112b may be greater than that of the redistribution layer 142. The redistribution layer 142 may be formed by a fine semiconductor process, or the like, for thinness, a fine pitch, and the like. Therefore, a thickness of the redistribution layer 142 may be relatively small than those of the wiring layers 112a and 112b.

The vias 113 may penetrate through the insulating layer 111, and may electrically connect the first wiring layer 112 and the second wiring layer 112b to each other. A material of each of the vias 113 may be a conductive material. Each of the vias 113 may be completely filled with the conductive material, or the conductive material may be formed along a wall of each of via holes. Each of the vias 113 may be a through-via completely penetrating through the insulating layer 111, and may have a cylindrical shape or a sandglass shape, but is not limited thereto. When the number of insulating layers 111 is plural, the number of layers of the vias 113 may also be plural.

The image sensor 120 may be a complementary metal oxide semiconductor (CMOS) image sensor (CIS), but is not limited
thereto. The image sensor 120 may be formed on the basis of an active wafer. In this case, a base material of a body may be silicon (Si), germanium (Ge), gallium arsenide (GaAs), or the like. Various circuits may be formed on the body. The connection pads 120P may electrically connect the image sensor 120 to other components. A material of each of the connection pads 120P may be a conductive material such as aluminum (Al), or the like. The active surface of the image sensor 120 refers to a surface thereof on which the connection pads 120P are disposed. A passivation layer 120PS covering at least portions of the connection pads 120P may be formed on the body, if necessary. The passivation layer 120PS may be an oxide film, a nitride film, or the like, or be a double layer of an oxide layer and a nitride layer. In addition, a photosensitive polyimide layer (not illustrated) may be disposed on the passivation layer 120PS, if necessary. An insulating layer (not illustrated), and the like, may also be further disposed in other required positions. The optical lens 125 may be disposed on the active surface of the image sensor 120. The optical lens 125 may be a lens designed so that optical characteristics such as a refractive index, a magnetic permeability, and the like, are within a desired range. A material of the optical lens 125 is not particularly limited, but may be, for example, glass. However, the material of the optical lens 125 is not limited thereto. The optical lens 125 may be formed on the active surface of the image sensor 120 on a wafer and be integrated with the image sensor 120.

Passive components 128 may be disposed in the through-hole 110H of the connection member 110, if necessary. The passive components 128 may be disposed side by side with the image sensor 120 in the through-hole 110H. The passive components 128 may be electrically connected to the redistribution layer 142 through third vias 143c penetrating through at least portions of the insulating member 141. The image sensor 120 and the passive components 128 may be electrically connected to each other through the redistribution layer 142. The passive components 128 may be the known passive components such as capacitors, inductors, beads, or the like.

The encapsulant 130 may protect the image sensor 120. An encapsulation form of the encapsulant 130 is not particularly limited, and may be a form in which the encapsulant 130 surrounds at least portions of the image sensor 120. For example, the encapsulant 130 may cover at least portions of the connection member 110 and the inactive surface of the image sensor 120, and fill at least portions of spaces between walls of the through-hole 110H and the side surfaces of the image sensor 120. In addition, the encapsulant 130 may also cover side surfaces of the optical lens 125. That is, the encapsulant 130 may cover the inactive surface and the side surfaces of the image sensor 120, and cover at least portions of the active surface of the image sensor 120. Certain materials of the encapsulant 130 are not particularly limited. For example, an insulating material may be used as the certain materials of the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, the known molding material such as an epoxy molding compound (EMC), or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material. Meanwhile, a material and a thickness of the encapsulant 130 may be adjusted so that the encapsulant 130 (i.e., the portion of the encapsulant 130 vertically below the image sensor 120) is substantially symmetrical to the insulating member 141 (i.e., the portion of the insulating member 141 between the optical lens 125 and the infrared cut-off filter 150) in relation to the connection member 110, which may be more effectively in controlling the warpage of the fan-out sensor package. Here, the encapsulant 130 being substantially symmetrical to the insulating member 141 in relation to the connection member 110 means that the encapsulant 130 is exactly symmetrical to the insulating member 141 in relation to the connection member 110. The encapsulant 130 being substantially symmetrical to the insulating member 141 in relation to the connection member 110 also means that if there is a difference in thickness caused, for example, by process/measurement error or variation which is recognizable by one of ordinary skill in the art, the encapsulant 130 may be considered to be substantially symmetrical to the insulating member 141 in relation to the connection member 110.

The insulating member 141 may be used as a kind of build-up layer for forming the redistribution layer 142. In addition, the insulating member 141 may protect the redistribution layer 142. A material of the insulating member 141 may be an insulating material. In this case, the insulating material may be a photosensitive insulating material such as a PID resin. It may be advantageous in forming fine patterns that the insulating material is the photosensitive insulating material. When the insulating member 141 includes multiple layers, materials of the multiple layers of the insulating member 141 may be the same as each other, and may also be different from each other, if necessary. When the insulating member 141 includes the multiple layers, the multiple layers of the insulating member 141 may be integrated with each other depending on a process, such that a boundary therebetween may also not be apparent. The insulating member 141 may cover the optical lens 125. In this case, the PID resin that may match optical characteristics such as a refractive index, a magnetic permeability, and the like, to those of the optical lens may be used as the material of the insulating member 141. In this case, when the optical characteristics are maintained by finely managing surface roughness and flatness of the insulating member 141, the optical lens 125 may be covered and protected with the insulating member 141. For example, the optical characteristics may be improved by significantly decreasing the surface roughness of the insulating member 141 to be 100 nm or less and finely managing the flatness of the insulating member 141 to be 10 pm or less.

The vias 143a, 143b, and 143c may electrically connect the connection pads 120P, the redistribution layer 142, the wiring layer 112a, the passive components 128, and the like, formed on different layers to each other, resulting in an electrical path in the fan-out sensor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have all of the shapes known in the related art, such as a tapered shape, a cylindrical shape, and the like. Meanwhile, the optical lens 125 may be disposed between the active surface of the image sensor 120 and the insulating member 141, and the image sensor 120 and the insulating member 141 may thus have a step therebetween. Therefore, the first vias 143a electrically connecting the redistribution layer 142 and the connection pads 120P to each other may penetrate through at least portions of the encapsulant 130 as well as the insulating member 141. On the other hand, the second vias 143b electrically connecting the redistribution layer 142 and the first wiring layer 112a to each other may penetrate through only at least portions of the insulating member 141. That is, the first vias 143a may have a height greater than that of the second vias 143b.

An infrared cut-off filter 150 may be disposed on the insulating member 141. The infrared cut-off filter 150 may be disposed in a region corresponding to the sensor region 120S of the image sensor 120 and the optical lens 125. The infrared cut-off filter 150 may be disposed to further improve the optical characteristics. The infrared cut-off filter 150 may be the known filter for filtering a specific wavelength band, for example, an infrared band. The infrared cut-off filter 150 may be formed by laminating an optical film or coating an optical liquid coating material.

Openings exposing at least portions of the second wiring layer 112b may be formed in a lower portion of the encapsulant 130, and the electrical connection structures 180 may be disposed in the openings. The electrical connection structures 180 may be additionally configured to physically or electrically externally connect the fan-out sensor package 100A. For example, the fan-out sensor package 100A may be mounted on the main board of the electronic device through the electrical connection structures 180. An underbump metal layer (not illustrated) connected to the exposed second wiring layer 112b may be formed in the openings formed in the lower portion of the encapsulant 130, and the electrical connection structures 180 may be connected to the underbump metal layer (not illustrated).

Each of the electrical connection structures 180 may be formed of a conductive material, for example, a solder, or the like. However, this is only an example, and a material of each of the electrical connection structures 180 is not particularly limited thereto. Each of the electrical connection structures 180 may be a land, a ball, a pin, a bump, or the like. The electrical connection structures 180 may be formed as a multilayer or single layer structure. When the electrical connection structures 180 are formed as a multilayer structure, the electrical connection structures 180 may include a copper (Cu) pillar and a solder. When the electrical connection structures 180 are formed as a single layer structure. the electrical connection structures 180 may include a tin-silver solder or copper (Cu). However, this is only an example, and the electrical connection structures 180 are not limited thereto. The number, an interval, a disposition form, and the like, of electrical connection structures 180 are not particularly limited, but may be sufficiently modified depending on design particulars by those skilled in the art. For example, the electrical connection structures 180 may be provided in an amount of several tens to several thousands according to the number of connection pads 120P of the image sensor 120, but are not limited thereto, or may be provided in an amount of several tens to several thousands or more or several tens to several thousands or less. At least one of the electrical connection structures 180 may be disposed in a fan-out region. The fan-out region is a region except for the region in which the image sensor 120 is disposed. That is, the fan-out sensor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (EGA) package, a land grid array (LGA) package, or the like, the fan-out package may be mounted on an electronic device without a separate board. Thus, the fan-out package may be manufactured to have a small thickness, and may have price competitiveness.

Meanwhile, a metal shield 191 protecting a region in which the infrared cut-off filter 150 is not disposed may be disposed on the insulating member 141 of the fan-out sensor package 100A according to the exemplary embodiment. In addition, a display panel 192 may be disposed on the metal shield 191. In this case, the fan-out sensor package 100A according to the exemplary embodiment may be modularized. The metal shield 191 and the display panel 192 may be attached to each other using the known adhesive, or the like. The display panel 192 may be an organic light emitting diode (OLED) panel. Light emitted from the OLED panel 192 may arrive at the image sensor 120 through the infrared cut-off filter 150, the optical lens 125, and the like. In this case, when a finger of a user is recognized on the OLED panel 192, the image sensor 120 may recognize an image of specific light transferred from the OLED panel 192 thereto through the infrared cut-off filter 150 and the optical lens 125. That is, an optical fingerprint sensor module may be provided.

Meanwhile, although not illustrated in the drawings, a metal layer (not illustrated) may be further disposed on the wall of the through-hole 110H, if necessary. The metal layer (not illustrated) may serve to effectively dissipate heat generated from the image sensor 120. In addition, the metal layer may also serve to block electromagnetic waves. In addition, a separate semiconductor chip (not illustrated) having a function that is the same as or different from that of the image sensor 120, for example, a boost integrated circuit (IC), a control IC, or the like, may be disposed together with the image sensor 120 in the through-hole 110H, if necessary. In addition, the number of through-holes 110H may be plural, if necessary, and the abovementioned semiconductor chip or passive components may be disposed in the through-holes 110H, respectively. Alternatively, the abovementioned semiconductor chip or the passive components may be disposed in the connection member 110.

FIGS. 11A through 11D are schematic views illustrating an example of processes of manufacturing the fan-out sensor package of FIG. 9.

Figure 11A:
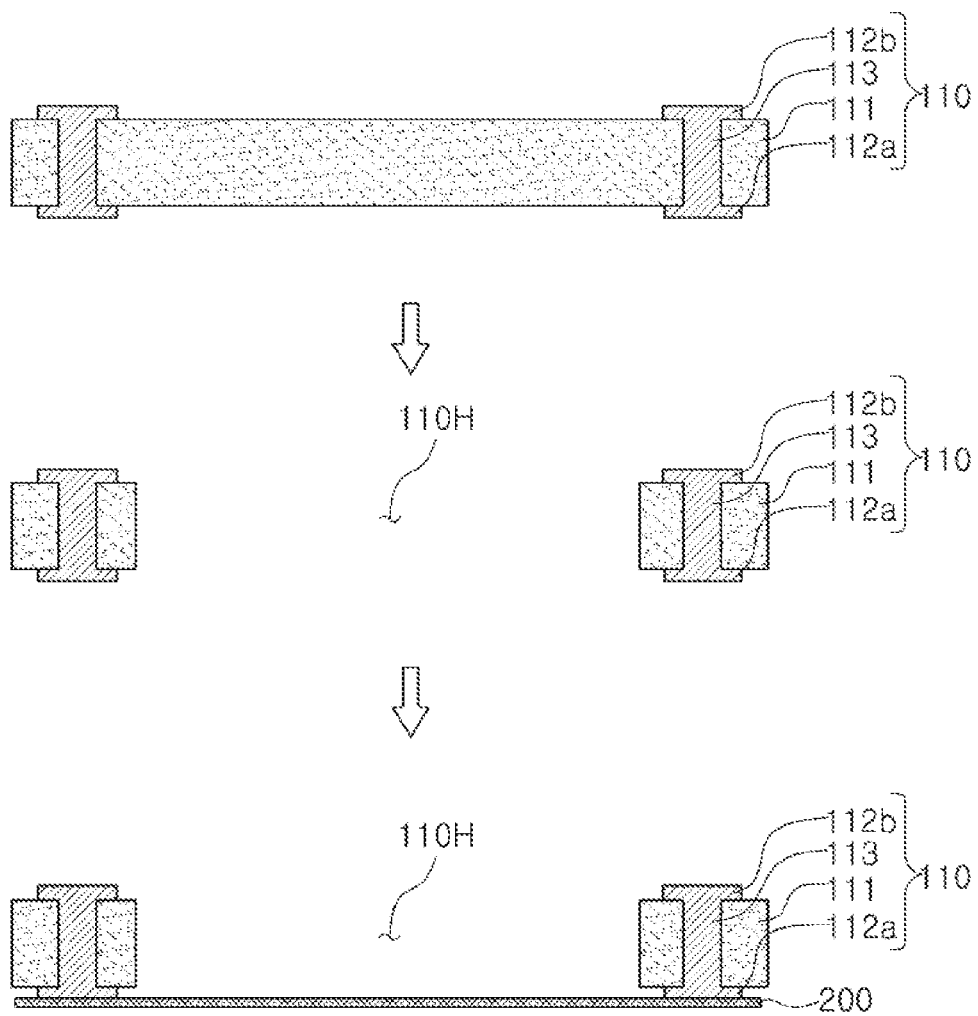
FIGS. 11A through 11D are schematic views illustrating an example of processes of manufacturing the fan-out sensor package of FIG. 9.

Referring to FIG. 11A, the connection member 110 may be first manufactured. The connection member 110 may be manufactured by preparing a material such as a copper clad laminate (CCL), or the like, as a material of the insulating layer 111, forming via holes in the material, and forming the wiring layers 112a and 112b and the vias 113 by the known plating method. Then, the through-hole 110H may be formed in the connection member 110. The through-hole 110H may be formed using laser drilling and/or mechanical drilling, but is not limited thereto. Meanwhile, the through-hole 110H of the connection member 110 may be formed at the time of forming the via holes, if necessary. Then, a tape 200 may be attached to a lower portion of the connection member 110. A material of the tape 200 is not particularly limited. That is, all the materials that are attachable and detachable may be used as the material of the tape 200.

Figure 11B:
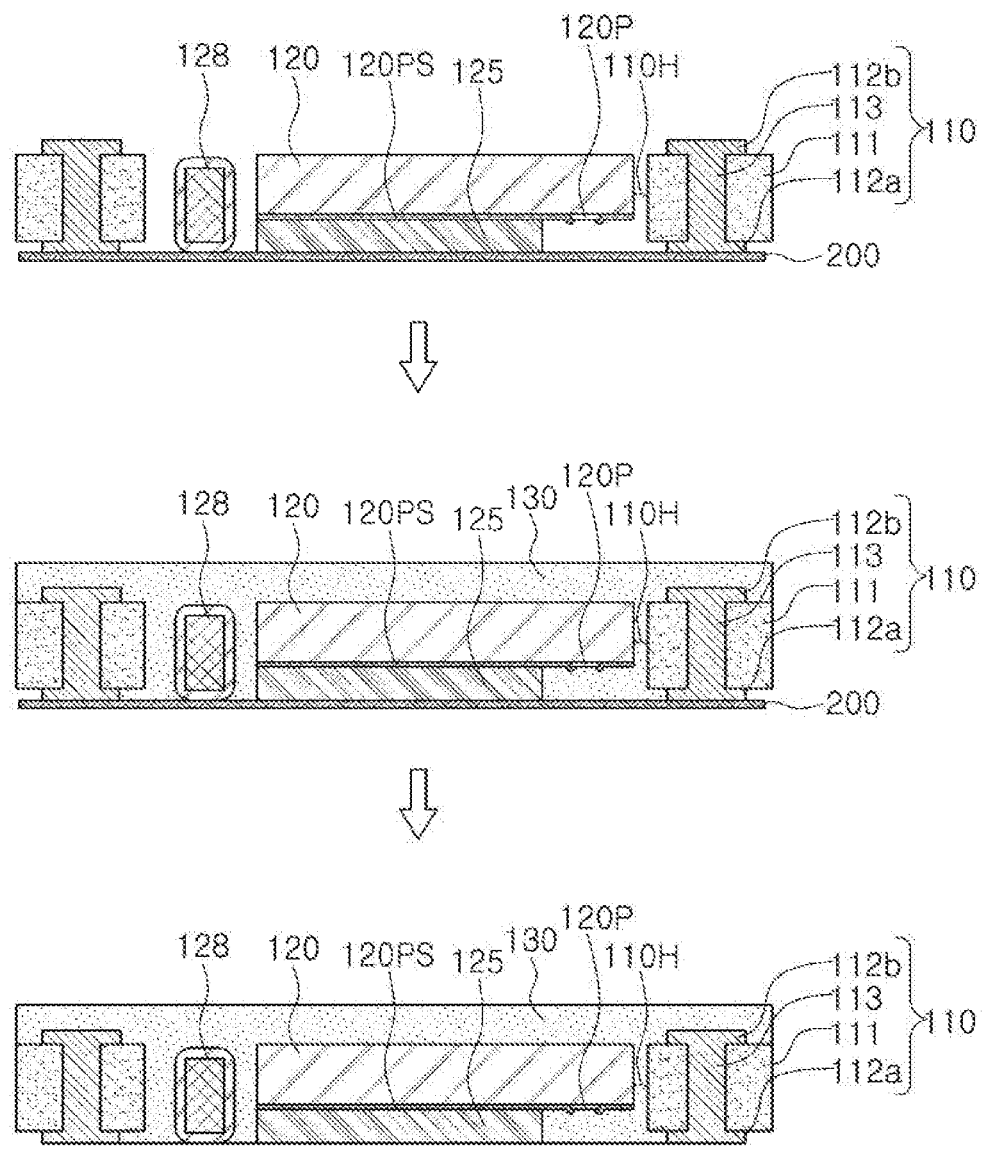

Then, referring to FIG. 11B, the image sensor 120 to which the optical lens 125 is attached may be disposed in the through-hole 110H of the connection member 110. In this case, the image sensor 120 may be disposed in a face-down manner so that the optical lens 125 is attached to the tape 200. Then, at least portions of the connection member 110, the image sensor 120, and the optical lens 125 may be encapsulated with the encapsulant 130. Meanwhile, the encapsulation may be performed by a method of laminating a film for forming the encapsulant 130 in a b-stage and then hardening the film or a method of applying a liquid-phase material for forming the encapsulant 130 and then hardening the material.

Figure 11C:
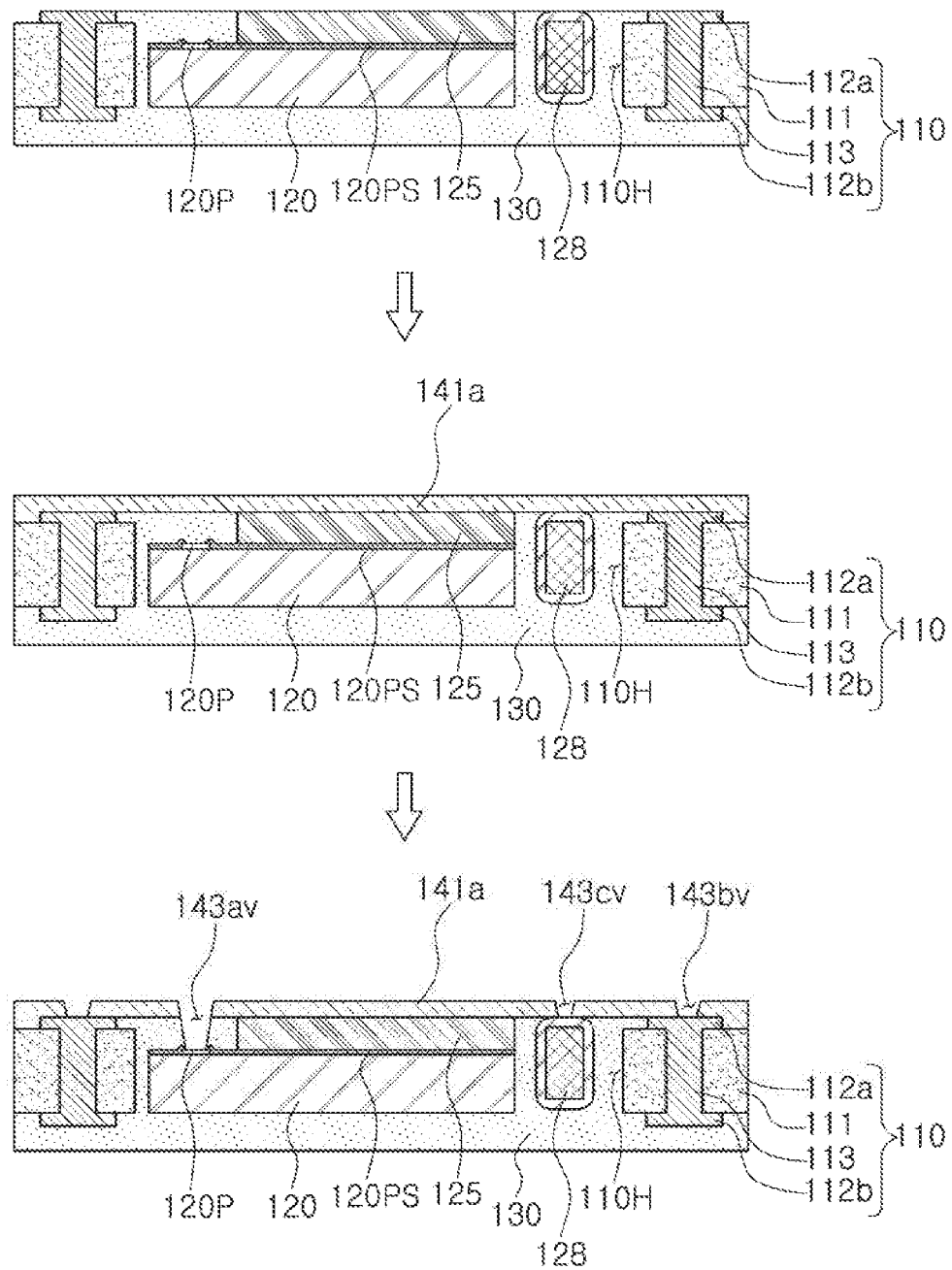

Then, referring to FIG. 11C, a panel manufactured up to now may be reversed. Then, a first insulating layer 141a covering the optical lens 125 may be formed on the active surface of the image sensor 120. The first insulating layer 141a may be formed by the known laminating method or coating method. Then, first via holes 143av penetrating through at least portions of the first insulating layer 141a and the encapsulant 130 and second and third via holes 143bv and 143cv penetrating through only at least portions of the first insulating layer 141a may be formed. The via holes 143av, 143bv, and 143cv may be formed by the known photolithography method or using mechanical drilling and/or laser drilling depending on materials of the first insulating layer 141a and the encapsulant 130. A combination of the known photolithography method and the mechanical drill and/or the laser drill may also be used, if necessary.

Figure 11D:
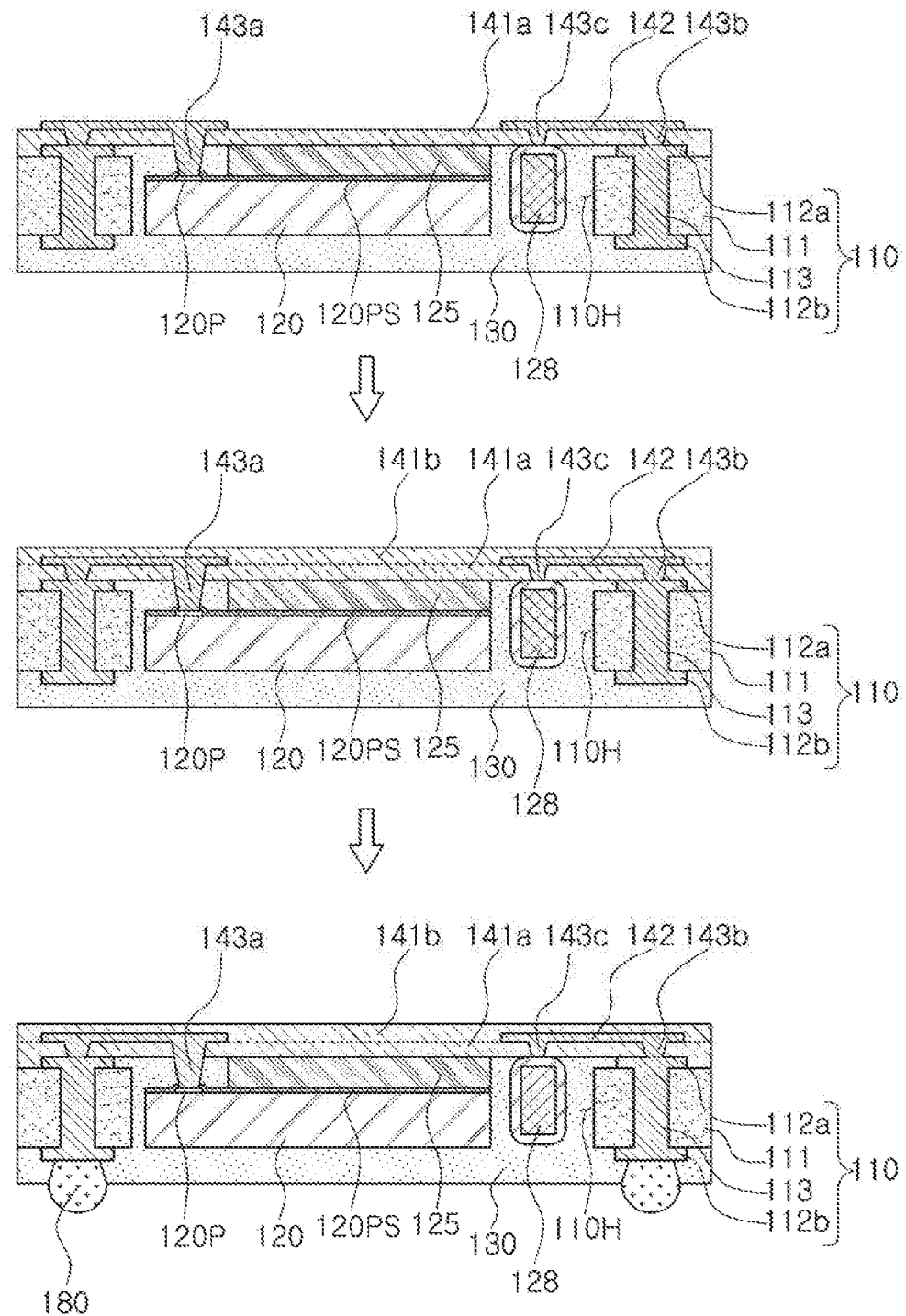

Then, referring to FIG. 11D, the vias 143a, 143b, and 143c, and the redistribution layer 142 may be formed. The vias 143a, 143b, and 143c and the redistribution layer 142 may be formed by the known plating process. Then, a second insulating layer 141b may be formed on the first insulating layer 141a. The second insulating layer 141b may also be formed by the known laminating method or coating method. Therefore, the insulating member 141 may be formed. Then, the openings exposing at least portions of the second wiring layer 112b of the connection member 110 may be formed in the lower portion of the encapsulant 130, and the electrical connection structures 180 may be formed in the openings. Then, the infrared cut-off filter 150, the metal shield 191, the display panel 192, and the like, may be disposed, if necessary.

Figure 12:
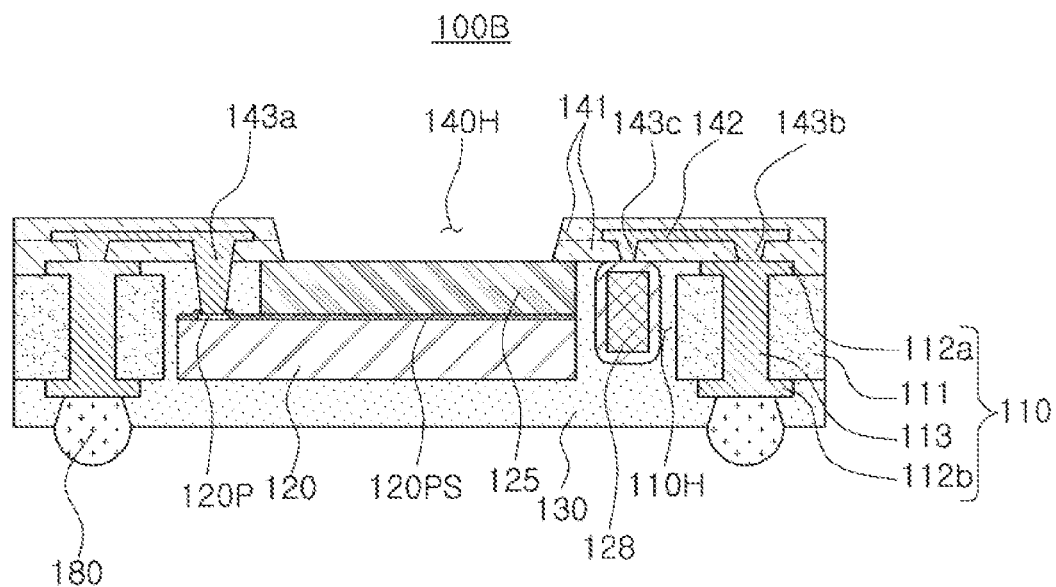
FIG. 12 is a schematic cross-sectional view illustrating another example of a fan-out sensor package.

FIG. 12 is a schematic cross-sectional view illustrating another example of a fan-out sensor package.

Referring to the drawing, in a fan-out sensor package 100B according to another exemplary embodiment in the present disclosure, an opening 140H may be formed in an insulating member 141 to expose an optical lens 125. In this case, a photosensitive insulating material that does not have optical characteristics may be used as a material of the insulating member 141. A description for other configurations and a description for a method of manufacturing the fan-out sensor package overlap those described above, and are thus omitted.

Figure 13:
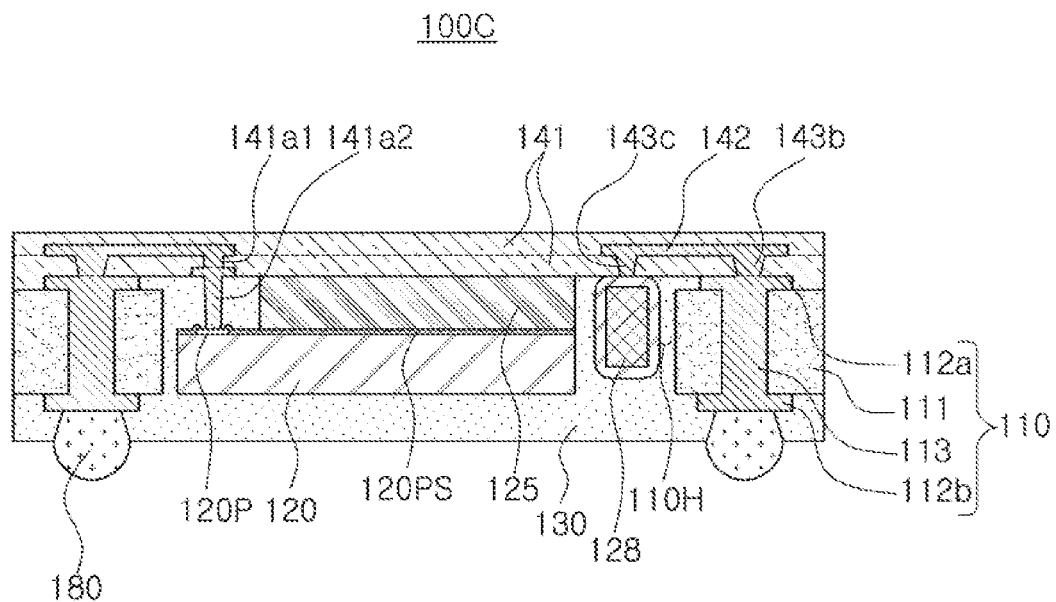
FIG. 13 is a schematic cross-sectional view illustrating another example of a fan-out sensor package.

FIG. 13 is a schematic cross-sectional view illustrating another example of a fan-out sensor package.

Referring to the drawing, in a fan-out sensor package 100C according to another exemplary embodiment in the present disclosure, first vias 143a1 and 143a2 may include a plurality of layers. That is, the first vias 143a1 and 143a2 may include fourth vias 143a1 penetrating through at least portions of an insulating member 141 and fifth vias 143a2 penetrating through at least portions of an encapsulant 130. The fourth vias 143a1 and the fifth vias 143a2 may be connected to each other through via pads disposed on the encapsulant 130. A description for other configurations and a description for a method of manufacturing the fan-out sensor package overlap those described above, and are thus omitted. Meanwhile, the features of the fan-out sensor package 100B according to another exemplary embodiment may also be combined with those of the fan-out sensor package 100C according to another exemplary embodiment.

Figure 14:
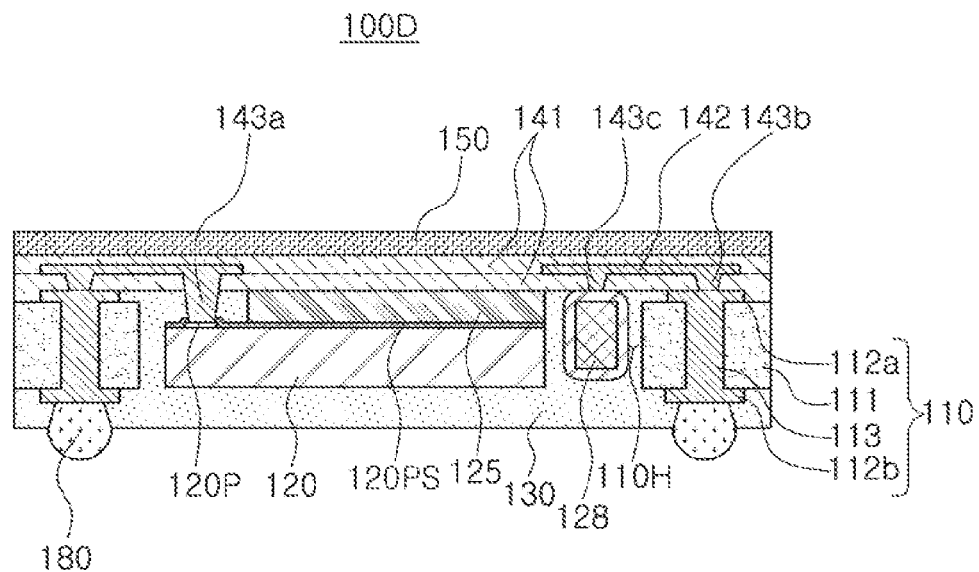
FIG. 14 is a schematic cross-sectional view illustrating another example of a fan-out sensor package.

FIG. 14 is a schematic cross-sectional view illustrating another example of a fan-out sensor package.

Figure 15:
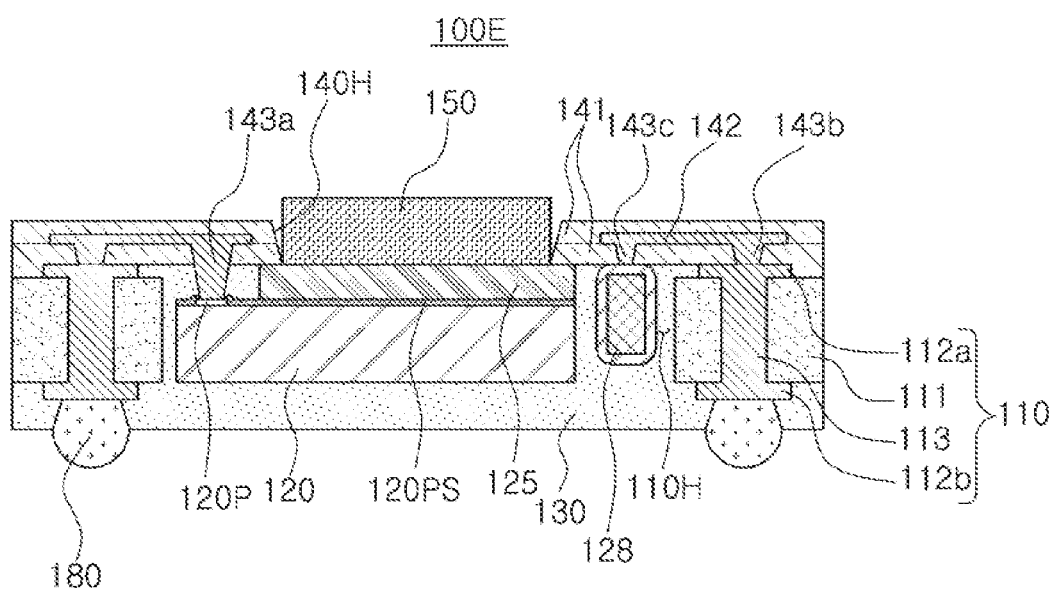
FIG. 15 is a schematic cross-sectional view illustrating another example of a fan-out sensor package.

FIG. 15 is a schematic cross-sectional view illustrating another example of a fan-out sensor package.

Referring to the drawings, in fan-out sensor packages 100D and 100E according to another exemplary embodiment in the present disclosure, infrared cut-off filters 150 may be disposed in various forms. For example, as illustrated in FIG. 14, the infrared cut-off filter 150 may be formed over an entire surface of an insulating member 141. Alternatively, as illustrated in FIG. 15, the infrared cut-off filter 150 may be formed on only a portion of an insulating member 141 corresponding to an optical lens 125, and when an opening 140H is formed in the insulating member 141, the infrared cut-off filter 150 may be formed in the opening 140H to be in contact with the optical lens 125. A description for other configurations and a description for a method of manufacturing the fan-out sensor package overlap those described above, and are thus omitted. Meanwhile, the features of the fan-out sensor packages 100D and 100E according to another exemplary embodiment may also be combined with those of the fan-out sensor package 100C according to another exemplary embodiment.

Figure 16:
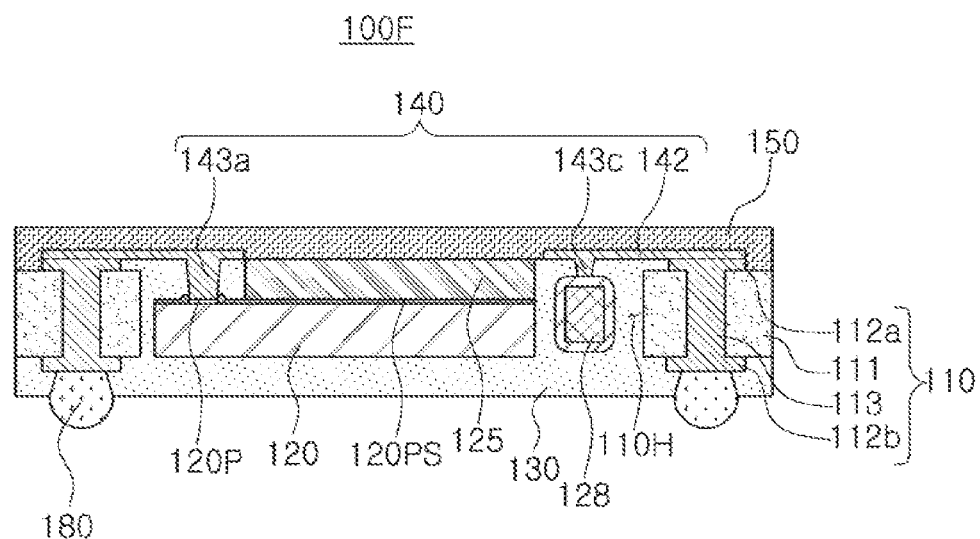
FIG. 16 is a schematic cross-sectional view illustrating another example of a fan-out sensor package.

FIG. 16 is a schematic cross-sectional view illustrating another example of a fan-out sensor package.

Referring to the drawing, in a fan-out sensor package 100F according to another exemplary embodiment in the present disclosure, a redistribution layer 142 may be in direct contact with a first wiring layer 112a of a connection member 110 without vias. That is, the redistribution layer 142 may be formed on an encapsulant 130 and extend to the first wiring layer 112a. In this case, an insulating member 141 may be omitted, and the redistribution layer 142 may thus be covered with an infrared cut-off filter 150 disposed on an encapsulant 130. The redistribution layer 142 may be electrically connected to connection pads 120P through first vias 143a penetrating through only at least portions of the encapsulant 130. Meanwhile, also in this case, the infrared cut-off filter 150 and an optical lens 125 may be in contact with each other. A description for other configurations and a description for a method of manufacturing the fan-out sensor package overlap those described above, and are thus omitted.

Figure 17:
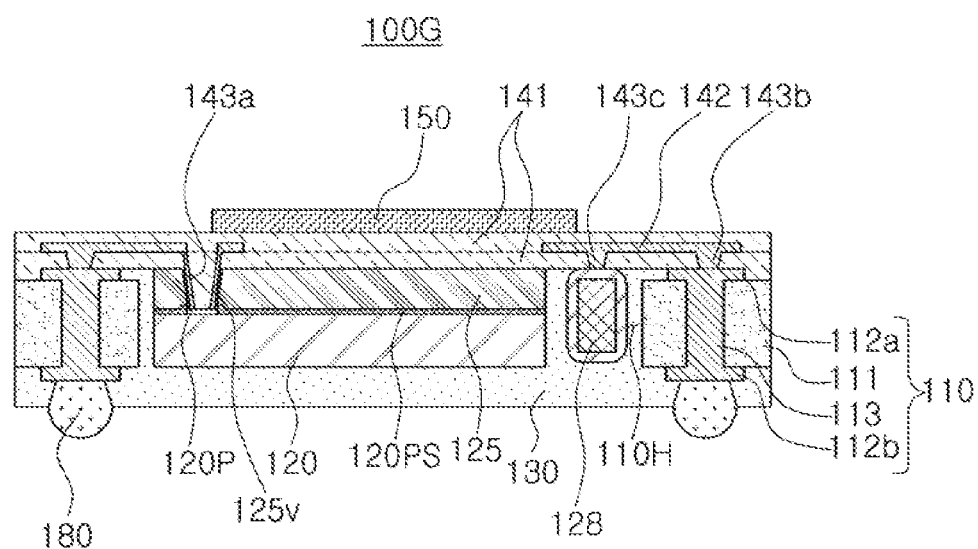
FIG. 17 is a schematic cross-sectional view illustrating another example of a fan-out sensor package.

FIG. 17 is a schematic cross-sectional view illustrating another example of a fan-out sensor package.

Referring to the drawing, in a fan-out sensor package 100G according to another exemplary embodiment in the present disclosure, an image sensor 120 and an optical lens 125 may have substantially the same size. In this case, a trench 125v may be formed in the optical lens 125, such that first vias 143a do not penetrate through an encapsulant 130, but may penetrate through the optical lens 125 and be then connected to connection pads 120P of the image sensor 120. That is, a redistribution layer 142 may be electrically connected to connection pads 120P through first vias 143a penetrating through at least portions of an insulating member 141 and the optical lens 125. Meanwhile, when the image sensor 120 and the optical lens 125 have substantially the same size, after the optical lens 125 is formed on the image sensor 120 on a wafer, a separate additional cutting process may not be required or a core portion or an e-bar structure may be removed or be significantly reduced. A description for other configurations and a description for a method of manufacturing the fan-out sensor package overlap those described above, and are thus omitted. Meanwhile, the features of the fan-out sensor packages 100B, 100D, 100E, and 100F according to another exemplary embodiment may be combined with those of the fan-out sensor package 100G according to another exemplary embodiment.

Figure 18:
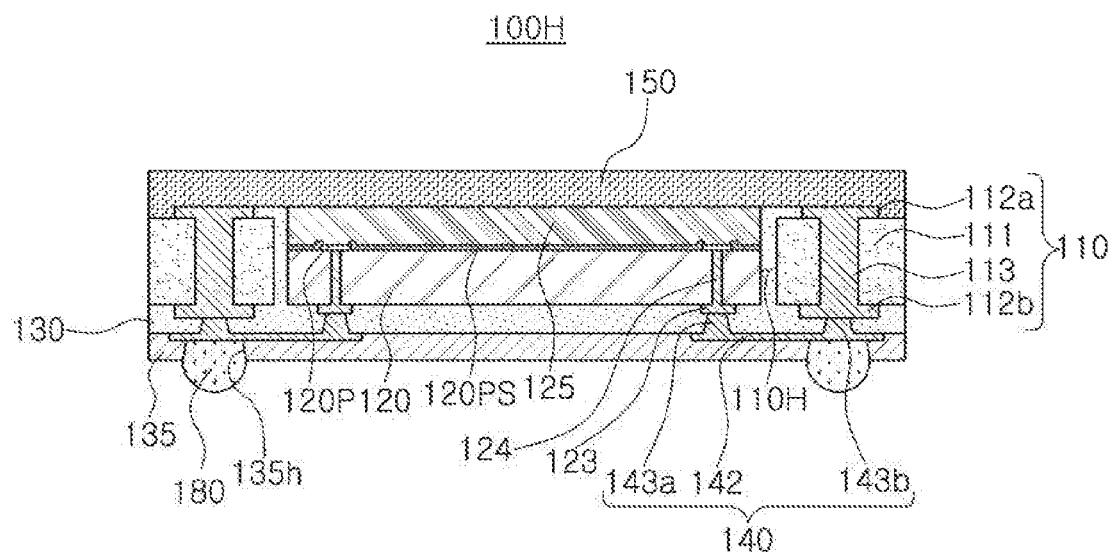
FIG. 18 is a schematic cross-sectional view illustrating another example of a fan-out sensor package.

FIG. 18 is a schematic cross-sectional view illustrating another example of a fan-out sensor package.

Referring to the drawings, in a fan-out sensor package 100H according to another exemplary embodiment in the present disclosure, an image sensor 120 may include electrode pads 123 disposed on an inactive surface of the image sensor 120 and vias 124 penetrating through a body of the image sensor 120 and electrically connecting connection pads 120P and the electrode pads 123 to each other. Therefore, a redistribution layer 142 is not disposed on an active surface of the image sensor 120, but may be disposed on the inactive surface of the image sensor 120. In detail, the redistribution layer 142 may be disposed on an encapsulant 130 adjacent to the inactive surface of the image sensor 120. The redistribution layer 142 may be electrically connected to the electrode pads 123 and a second wiring layer 112b of a connection member 110 through first and second vias 143a and 143b each penetrating through at least portions of the encapsulant 130, respectively. A passivation layer 135 having openings 135h exposing at least portions of the redistribution layer 142 may be disposed on the encapsulant 130. Electrical connection structures 180 may be formed in the openings 135h of the passivation layer 135, an underbump metal layer (not illustrated) may be formed in the openings 135h, if necessary, and the electrical connection structures 180 may be connected to the underbump metal layer (not illustrated). An infrared cut-off filter 150 may be disposed on an optical lens 125, and may cover the optical lens 125 and a first wiring layer 112a of the connection member 110. The passivation layer 135 may be ABF, or the like, including an inorganic filler and an insulating resin, but is not limited thereto. Meanwhile, the image sensor 120 and the optical lens 125 may have substantially the same size, and when the image sensor 120 and the optical lens 125 have substantially the same size, after the optical lens 125 is formed on the image sensor 120 on a wafer, a separate additional cutting process may not be required or a core portion or an e-bar structure may be removed or be significantly reduced A description for other configurations and a description for a method of manufacturing the fan-out sensor package overlap those described above, and are thus omitted.

Figure 19:
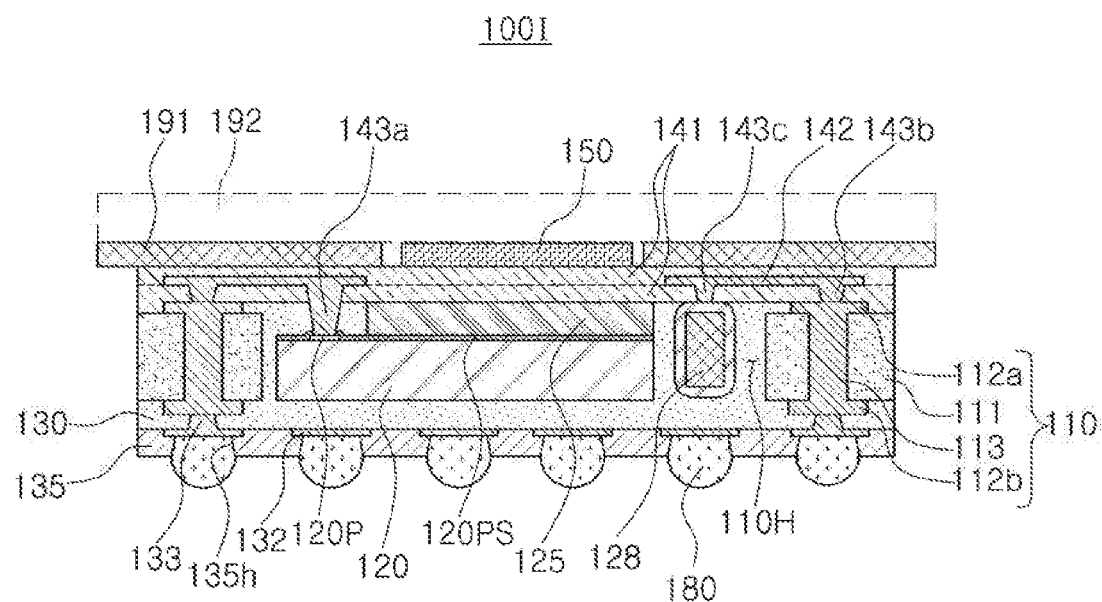
FIG. 19 is a schematic cross-sectional view illustrating another example of a fan-out sensor package.

FIG. 19 is a schematic cross-sectional view illustrating another example of a fan-out sensor package.

Referring to the drawing, a fan-out sensor package 1001 according to another exemplary embodiment in the present disclosure may further include a backside redistribution layer 132 disposed on an encapsulant 130, backside vias 133 penetrating through at least portions of the encapsulant 130 and electrically connecting a second wiring layer 112b of a connection member 110 and the backside redistribution layer 132 to each other, and a passivation layer 135 disposed on the encapsulant 130 and having openings 135h exposing at least portions of the backside redistribution layer 132. Electrical connection structures 180 may be formed in the openings 135h of the passivation layer 135, an underbump metal layer (not illustrated) may be formed in the openings 135h, if necessary, and the electrical connection structures 180 may be connected to the underbump metal layer (not illustrated). A fan-in region on the encapsulant 130 may also be used as a routing region by forming the backside redistribution layer 132. Therefore, a larger number of electrical connection structures 180 may be formed. A description for other configurations and a description for a method of manufacturing the fan-out sensor package overlap those described above, and are thus omitted.

As set forth above, according to the exemplary embodiments in the present disclosure, an ultra-miniature ultra-thin fan-out sensor package in which a structure is simple, a warpage problem may be solved, and sensing sensitivity is excellent, and an optical fingerprint sensor module including 10 the same may be provided.

While exemplary embodiments have been shown and described above, it will be apparent to those skilled in the art that modifications and variations could be made without departing from the scope of the present invention as defined 15 by the appended claims.

What is claimed is:

1. A fan-out sensor package comprising:
a finger print sensor having an active surface having connection pads and a sensor region disposed thereon and an inactive surface opposing the active surface;
an optical lens disposed on the active surface of the finger print sensor, the optical lens including a lower surface facing the active surface of the finger print sensor and an upper surface opposing the lower surface;
a passive component disposed adjacent to the finger print sensor;
an encapsulant encapsulating at least portions of the passive component, the finger print sensor, and the optical lens;
an electrical connection structures disposed on the encapsulant;
an insulating member covering the passive component, the active surface, and the upper surface of the optical lens; and
a redistribution layer disposed on the insulating member,
wherein the redistribution layer electrically connects the passive component, the connection pads, the electrical connection structures to each other, and
the active surface of the finger print sensor is spaced apart from the insulating member.

2. The fan-out sensor package of claim 1, further comprising,
a vertical connecting conductor disposed at a periphery of the finger print sensor and the passive component, the vertical connecting conductor electrically connects the redistribution layer and the electrical connection structures.

3. The fan-out sensor package of claim 2, wherein the redistribution layer is electrically connected to the connection pads through first vias penetrating through at least portions of the insulating member and the encapsulant, and is electrically connected to the vertical connecting conductor through second vias penetrating through at least portions of the insulating member, and
the first vias have a height greater than that of the second vias.

4. The fan-out sensor package of claim 3, wherein the first vias include third vias penetrating through at least portions of the insulating member and fourth vias penetrating through at least portions of the encapsulant, and
the third and fourth vias are connected to each other by via pads disposed on the encapsulant and having a size greater than that of the third and fourth vias.

5. The fan-out sensor package of claim 2,
wherein the redistribution layer is electrically connected to the connection pads through first vias penetrating through at least portions of the insulating member and the optical lens, and is electrically connected to the vertical connecting conductor through second vias penetrating through at least portions of the insulating member, and
the first vias have a height greater than that of the second vias.

6. The fan-out sensor package of claim 1, further comprising an infrared cut-off filter disposed on the insulating member.

7. The fan-out sensor package of claim 1, wherein the insulating member has an opening exposing the optical lens.

8. The fan-out sensor package of claim 7, further comprising an infrared cut-off filter disposed in the opening.

9. A fan-out sensor package comprising:
a finger print sensor having an active surface having connection pads and a sensor region disposed thereon and an inactive surface opposing the active surface;
an optical lens disposed on the active surface of the finger print sensor, the optical lens including a lower surface facing the active surface of the finger print sensor and an upper surface opposing the lower surface;
a vertical connecting conductor disposed at a periphery of the finger print sensor;
an encapsulant encapsulating at least portions of the vertical connecting conductor, the inactive surface of the finger print sensor, and the optical lens;
an insulating member covering the vertical connecting conductor, the encapsulant, the active surface of the finger print sensor, and the upper surface of the optical lens; and
a redistribution layer disposed on the insulating member, wherein the redistribution layer electrically connects the connection pads and the vertical connecting conductor to each other, and a thickness of the encapsulant covering the inactive surface of the finger print sensor is substantially same as a thickness of the insulating member.

10. The fan-out sensor package of claim 9, wherein the encapsulant covering a lower surface of the vertical connecting conductor is substantially symmetrical to the insulating member covering an upper surface of the vertical connecting conductor in relation to the vertical connecting conductor.

11. The fan-out sensor package of claim 9, further comprising:

a backside redistribution layer disposed on the encapsulant;

backside vias penetrating through at least portions of the encapsulant and electrically connecting the vertical connecting conductor and the backside redistribution layer to each other; and a passivation layer disposed on the encapsulant and having openings exposing at least portions of the backside redistribution layer.

12. The fan-out sensor package of claim 11, further comprising electrical connection structures formed in the openings of the passivation layer and electrically connected to the exposed backside redistribution layer.

13. A fan-out sensor package comprising:

a finger print sensor having an active surface having connection pads and a sensor region disposed thereon and an inactive surface opposing the active surface;

an optical lens disposed on the active surface of the finger print sensor;

a vertical connecting conductor disposed at a periphery of the finger print sensor;

an encapsulant encapsulating at least portions of the vertical connecting conductor, the finger print sensor, and the optical lens; and a redistribution layer electrically connecting the connection pads and the vertical connecting conductor to each other, wherein an upper surface of the vertical connecting conductor, an upper surface of the encapsulant, and an upper surface of the optical lens are coplanar with each other.

14. The fan-out sensor package of claim 13, wherein the redistribution layer is disposed on the encapsulant and in direct contact with the upper surface of the vertical connecting conductor.

15. The fan-out sensor package of claim 14, further comprising an infrared cut-off filter disposed on the encapsulant and the optical lens, wherein the redistribution layer is covered with the infrared cut-off filter.

16. The fan-out sensor package of claim 13, wherein the finger print sensor includes electrode pads disposed on the inactive surface and vias penetrating through a body of the finger print sensor and connecting the connection pads and the electrode pads to each other, and the redistribution layer is disposed on the encapsulant, is electrically connected to a lower surface of the vertical connecting conductor through first vias penetrating through at least portions of the encapsulant, and is electrically connected to the electrode pads through second vias penetrating through at least portions of the encapsulant.

17. The fan-out sensor package of claim 16, further comprising an infrared cut-off filter disposed on the encapsulant and the optical lens, wherein the infrared cut-off filter is in direct contact with the upper surface of the vertical connecting conductor, the upper surface of the encapsulant, and the upper surface of the optical lens.

18. The fan-out sensor package of claim 13, the finger print sensor is a complementary metal oxide semiconductor (CMOS) image sensor (CIS).

* * * * *